United States Patent [19]

Riordan et al.

[11] Patent Number: 5,317,601
[45] Date of Patent: May 31, 1994

[54] CLOCK DISTRIBUTION SYSTEM FOR AN INTEGRATED CIRCUIT DEVICE

[75] Inventors: Thomas J. Riordan, Los Altos; Albert M. Thaik, San Jose; Hai N. Nguyen, Milpitas, all of Calif.

[73] Assignee: Silicon Graphics, Mountain View, Calif.

[21] Appl. No.: 933,467

[22] Filed: Aug. 21, 1992

[51] Int. Cl.⁵ .......................... H04L 7/00; H03K 7/00; H03K 17/00; H03K 17/26
[52] U.S. Cl. ..................................... 375/107; 375/111; 375/118; 328/63; 328/72; 328/105; 307/262; 307/269
[58] Field of Search .................. 375/107, 111, 118; 328/62, 72, 105, 109, 63; 307/480, 262, 269; 371/1

[56] References Cited

U.S. PATENT DOCUMENTS

| | | | |
|---|---|---|---|
| 4,423,383 | 12/1983 | Svendsen | 328/62 |
| 5,043,596 | 8/1991 | Masuda et al. | 307/262 |
| 5,109,168 | 4/1992 | Rusu | 307/269 |
| 5,122,679 | 6/1992 | Ishii et al. | 307/269 |
| 5,140,184 | 8/1992 | Hamamoto et al. | 328/72 |
| 5,150,068 | 9/1992 | Kawashima et al. | 307/262 |

OTHER PUBLICATIONS

Boon et al., "High Performance Clock Distribution For CMOS ASICS", 1989, 15.4.1–15.4.5, IEEE 1989 Custom Integrated Circuits Conference.

Primary Examiner—Stephen Chin
Assistant Examiner—Duane Kobayashi
Attorney, Agent, or Firm—Townsend and Townsend Khourie and Crew

[57] ABSTRACT

Techniques for providing a number of precisely synchronized clock signals at a number of different frequencies at each of a plurality of locations on a chip. A number of synchronized clock signals are generated at an initial location on the chip, and distributed to the various locations with relative delay times that are equal to within a precision, which may be less than the ultimate precision required. A single synchronization signal is also generated at the initial location, and is distributed to the remote locations with delay times that are equal to each other to a precision that corresponds to the precision required of all the clock signals. Separate synchronization circuitry at each remote location receives the clock signals and the synchronization signal, and resynchronizes the clock signals to the precision with which the synchronization signal was distributed. The set of lines is configured as a tree structure. The clock generation system has a cycle-down mode wherein all the clock frequencies are divided by a desired divisor. The frequency division occurs in response to a cycle-down signal, but the different clock frequencies are not switched until all have their rising edges aligned. The result is that the state of the machine is preserved when the clocks are cycled down.

10 Claims, 5 Drawing Sheets

CLOCK DISTRIBUTION SYSTEM FOR AN INTEGRATED CIRCUIT DEVICE

BACKGROUND OF THE INVENTION

The present invention relates generally to integrated circuit devices (chips) and more specifically to techniques for distributing and synchronizing clock signals on a chip.

As semiconductor chips grow larger and faster, the need to control the timing becomes increasingly important. Many different functional portions of the chip are designed to be operating in a known time relationship to each other, and it is a fundamental assumption that a given clock signal at one portion of the chip will be substantially synchronized with the same clock signal at another portion of the chip. To the extent that the possibility of different delay times was recognized, a typical way of achieving a measure of synchronization was to attempt to equalize the various clock distribution lines. This is feasible, but becomes difficult when a large number of clock signals need to be synchronized at a number of locations on a large chip.

A further problem with high-speed processor chips is that they dissipate more power. While suitable heat sinks can avoid problems associated with the heat generated, the problem of power consumption remains. This can be a major issue with portable computers which run off a battery.

SUMMARY OF THE INVENTION

The present invention is drawn to techniques for providing a number of precisely synchronized clock signals at a number of different frequencies at each of a plurality of locations on a chip.

In broad terms, the invention contemplates generating a number of synchronized clock signals at an initial location on the chip, and distributing these signals to the various locations with relative delay times among the signals and the locations that are equal to within a first level of precision, which may be less than the ultimate precision required. A single synchronization signal is also generated at the initial location, and is distributed to the remote locations by a system of signal lines that are characterized by delay times that are equal to each other to within a second level of precision that corresponds to the precision required of all the clock signals. Separate synchronization circuitry is located at each remote location, and receives the clock signals and the synchronization signal. The synchronization signal is then used to resynchronize the clock signals to the precision with which the synchronization signal was distributed. The net result is that all the clock signals at all the remote locations have delays that are equal to within the second level of precision, which is considerably greater than the first level of precision with which they were distributed.

According to a further aspect of the invention, the clock signals and the synchronization signals are distributed to the remote locations over a set of lines configured as a tree structure. Each line is subdivided at a first location, with a plurality of branches being communicated to a corresponding plurality of intermediate locations. At each intermediate location, the line is further divided, possibly undergoing one or more subsequent divisions before the finally divided line branches reach the synchronization units at the remote locations.

In a specific embodiment where there are 12 remote locations, each line is divided into three main branches, each of which goes to one of three respective intermediate locations. At each intermediate location, the branch is divided into two sub-branches, and each sub-branch is further divided into two smaller sub-branches. As each line is divided, it becomes narrower. While the signal traces are configured for approximately equal delays to the remote synchronization units, extra care is taken with the synchronization signal. For example, the delay times for the synchronization signals are matched to 1% of the clock cycle or better (e.g., 50 ps for a 200-MHz clock speed) over a runs on the order of 1 cm.

According to a further aspect of the invention, the clock generation system has a cycle-down mode wherein all the clock frequencies are divided by a desired divisor. The divisor is defined by a set of mode bits, which are typically set by software. This allows the power consumption of a processor to be reduced during times when high-speed operation is not required. According to this aspect of the invention, the frequency division occurs in response to a cycle-down signal, but the frequency division is delayed until all the original clock signals are at the same predetermined reference point in their cycles. In the particular embodiment, the different clock frequencies are not switched until all have their rising edges aligned. The result is that the state of the machine is preserved when the clocks are cycled down.

A further understanding of the nature and advantages of the present invention may be realized by reference to the remaining portions of the specification and the drawings.

DESCRIPTION OF SPECIFIC EMBODIMENTS

Figure 1:
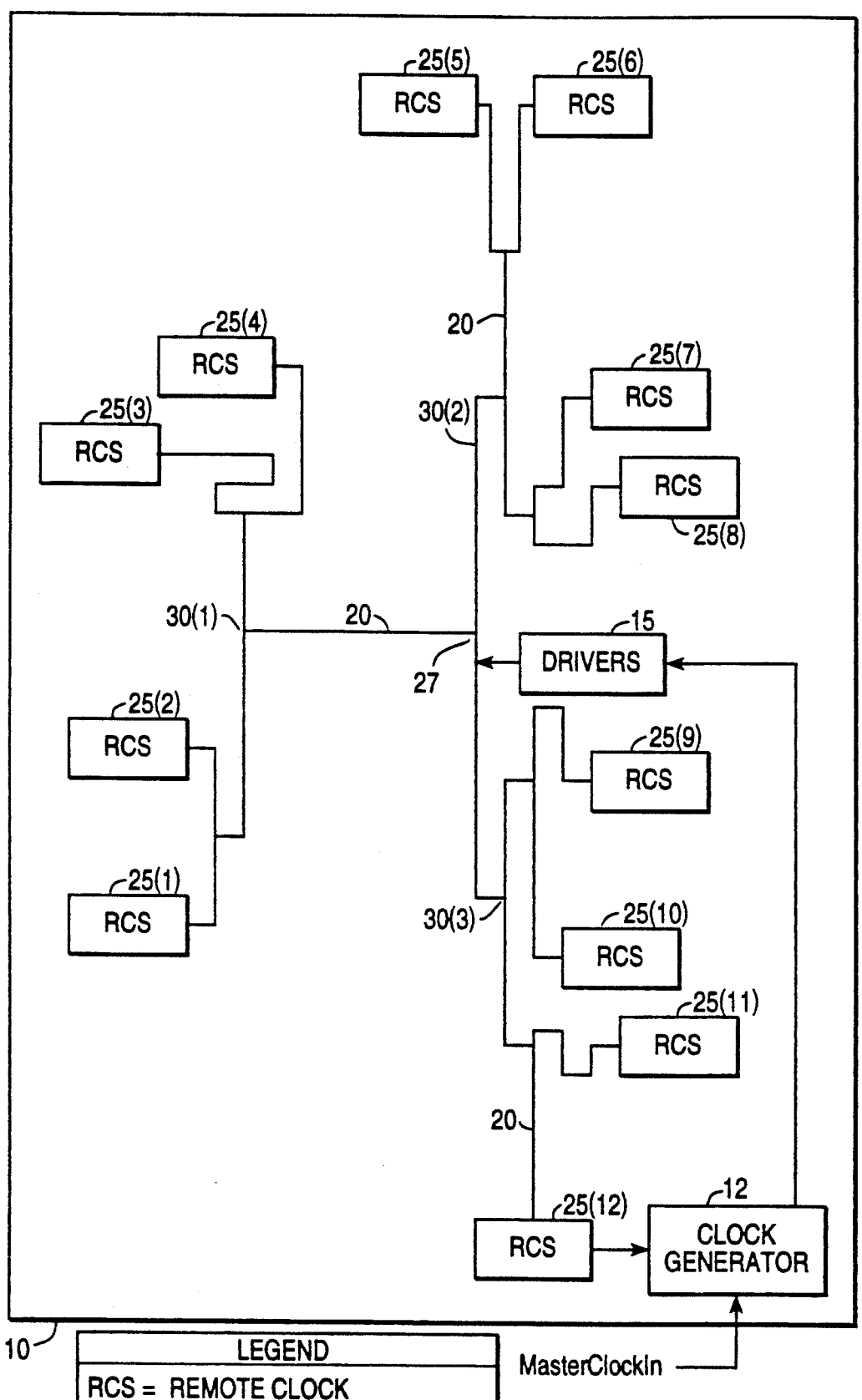
FIG. 1 is a schematic geometric view of a clock generation and distribution system on a semiconductor chip.

FIG. 1 is a schematic geometric view of a clock generation and distribution system on a semiconductor chip 10. In a specific embodiment, the chip is a CMOS RISC processor (MIPS 4000). As will be described in detail below, a clock generator 12 generates a number of initially synchronized clock signals and a synchronization signal at an initial location and communicates these signals to a set of drivers 15 that are located generally near the center of the chip. The drivers feed a network of distribution lines 20 which distribute the signals to a plurality of remote locations. Remote clock synchronization (RCS) circuits 25 use the synchronization signal to resynchronize the clock signals, which are used by the processor circuitry at those locations. In a specific embodiment there are 12 such locations, and the RCS circuits at these locations are designated 25(1) through 25(12). The particular functionality of the circuitry at the different locations is not a part of the present invention, but is set forth in Table 1 by way of background.

The clock distribution lines are configured in a tree-like structure. The lines from the driver outputs are initially split into three bundles near a first generally central location 27, and then the lines in each of the three bundles are split at three intermediate locations 30(1), 30(2), and 30(3). The lines are further split at a second set of intermediate locations with the individual sets of lines going to the RCS circuits at the remote locations.

In the specific embodiment, clock generator 12 provides six signals. All the clocks are referenced to a master clock signal (MasterClockIn) that is generated off the chip and communicated as an input clock signal to the chip. In the particular embodiment, MasterClockIn is a 50-MHz system clock. Signals derived from this include a signal (referred to as 1x) at the master clock frequency, a signal (referred to as 2x), at twice the master clock frequency, a synchronization signal (referred to as Sync4x) at 4 times the master clock frequency, a pair of signals (referred to as 4x and 4x+90°) for generating clock signals at four times the master clock frequency at the remote location, and a signal (referred to as PLL1x) at 1x that is fed back from the remote location as SyncPLL to synchronize the phase lock loop in the clock generator.

The clock lines to a given remote location are matched for approximately equal delays, but the lines for the Sync4x signal to the remote locations are more precisely matched. For example, the clock lines are distributed to the remote locations with delays equal to within about 400 ps, while the synchronization signal is distributed to the remote locations with delays equal to within about 50 ps, which represents 1% of the 200-MHz cycle. The ultimate precision for the resynchronized clock signals at the remote locations is on the order of 150 ps.

The clock generator includes the ability to divide the clock signals 1x, 2x, and 4x by fixed divisors without destroying the state of the machine. In the specific embodiment, division by 2, 4, 8, or 16 is possible, depending on the state of a CycleDown signal (a bit in the status register) and the value of a ModeBits signal (programmable at boot time). This is referred to as operation in the cycle-down mode, which will be described below. In the cycle-down mode, the clock signals at 1x, 2x, and 4x are distributed at the divided-down frequencies, but the Sync4x and PLL1x signals are distributed without being divided. The primary benefit of a cycle-down feature is that a processor can be slowed down and consume less power when it is not being actively used.

Figure 2:
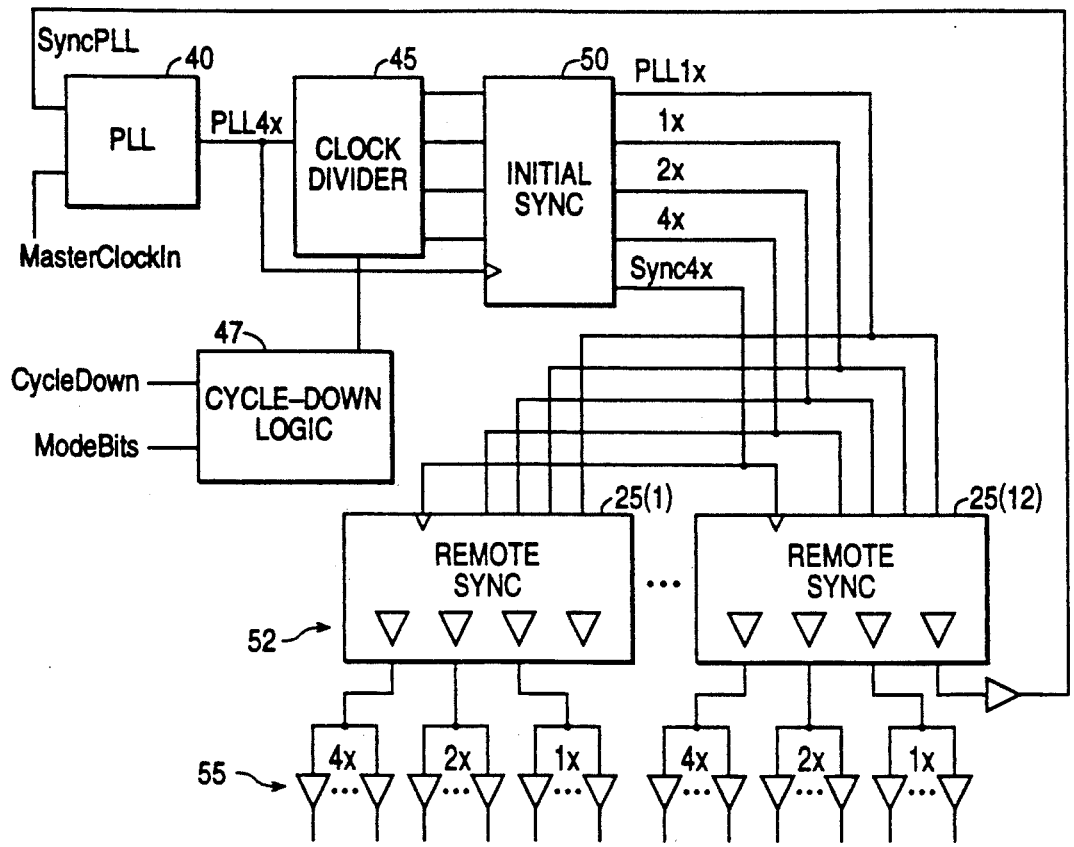
FIG. 2 is a high-level block diagram of the clock generation and distribution system.

FIG. 2 is a high-level block diagram of the clock generation and distribution system including the synchronization circuitry at the remote locations. A phase-lock loop (PLL) 40 receives the master clock input at a first input terminal and a distributed clock signal (referred to as SyncPLL) that is fed back to a second input terminal (for synchronization), and generates a signal (PLL4x) at four times the master clock frequency. This signal is used for generation of the derived clock signals and for initial synchronization. A clock divider 45 generates signals at submultiples ($\frac{1}{2}$, $\frac{1}{4}$) of this frequency, as well as signals whose frequencies are further divided by a divisor (2, 4, 8, 16). Whether these further divided signals are used depends on the signals applied to cycle-down logic 47. An initial synchronization circuit 50 synchronizes the signals from clock divider 45, and provides outputs at 1x, 2x, and 4x, as well as the synchronization signals Sync4x and PLL1x. As will be discussed in greater detail below, the 4x signal lines are used in normal mode to distribute fixed levels which are used at the remote locations to synthesize the 4x clock signals.

Each of RCS circuits 25(1) through 25(12) receives the distributed clock and synchronization signals, and utilizes the synchronization signal to synchronize the clock signals to a higher level of precision than that with which the clock signals were distributed. The RCS circuits include drivers 52 to provide the signals at 4x, 2x, and 1x (possibly divided down). The output line for each clock frequency is provided with an appropriate number of final drivers 55 to meet the circuit needs at the remote locations. Although the figure shows outputs at 1x, 2x, and 4x for each synchronization block, this is not normally the case where processor circuitry at the remote location does not require a particular frequency. For example, the 4x signal is used only by portions of the floating point and integer execution unit circuitry. Further, only one of the RCS circuits drives a version of PLL1x, which is called SyncPLL. Drivers 52 and drivers 55 are matched as will be described below.

Figure 3:
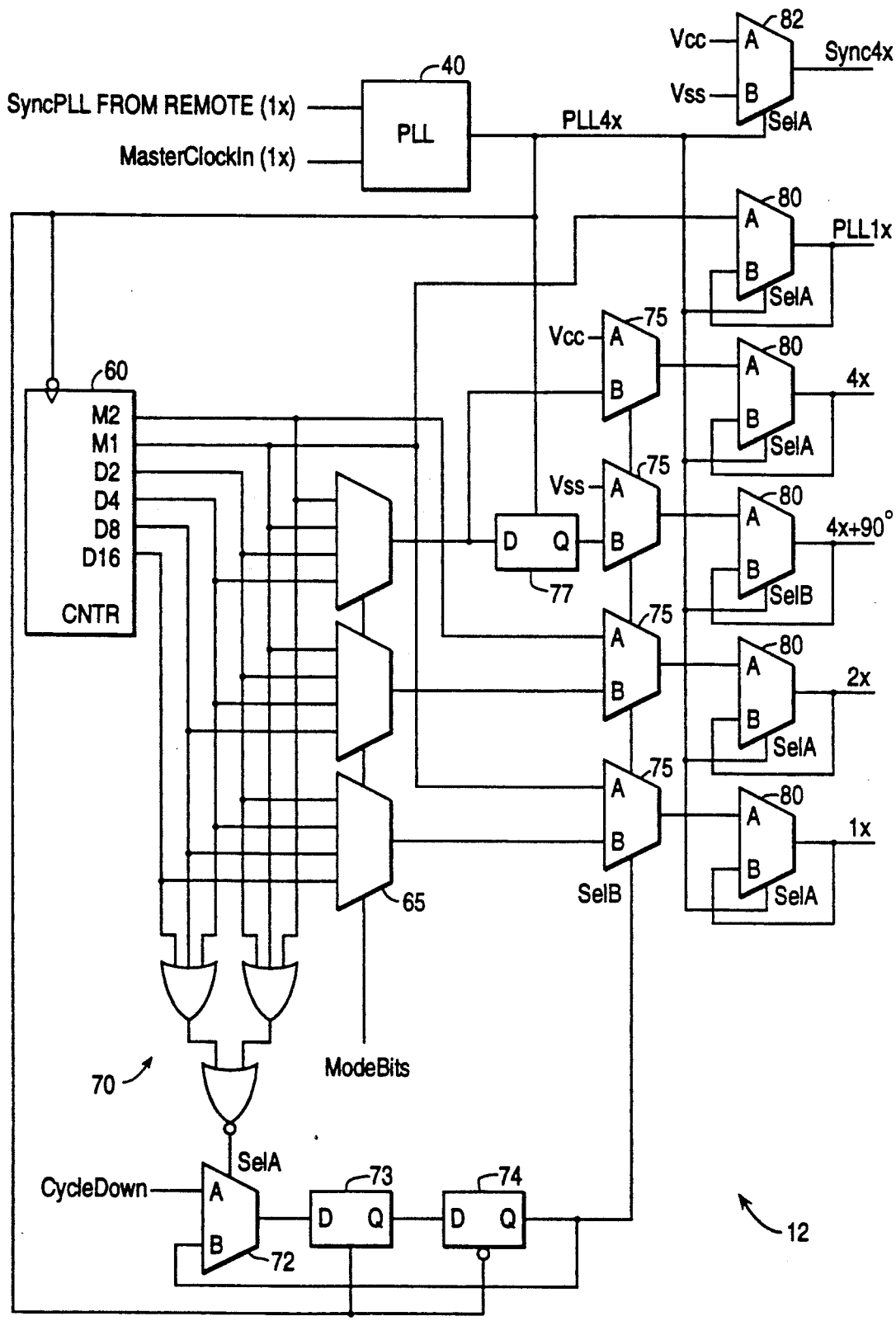
FIG. 3 is a logic schematic of the clock generation and initial synchronization circuitry, as well as the cycle-down circuitry.

FIG. 3 is a logic schematic of clock generator 12, which includes PLL 40 and circuit elements performing the functions described above in connection with clock divider 45, cycle-down logic 47, and initial synchronization circuit 50. The drawing is simplified in that all clock and select input signals are shown as single lines whereas the actual implementation uses complementary signal pairs. Thus, a bubble at a clock input signifies clocking on the falling edge rather than the rising edge of the clock signal.

A counter 60 is clocked by the falling edge of the PLL4x signal from PLL 40, and generates signals at submultiples of that frequency. In particular, it generates signals at 2x, 1x, as well as x/2, x/4, x/8, and x/16. These signals have their rising edges aligned to falling edges of PLL4x.

Combinations of the counter output signals go to a set of 4:1 multiplexers 65 to allow three-signal combinations at any of four frequency divisions ($\div 2$, $\div 4$, $\div 8$, and $\div 16$), depending on the value of ModeBits that is communicated to the multiplexers' select terminals. The counter output signals are also communicated to the input terminals of an OR-NOR gate network 70, which provides an output signal that is high when all the counter output signals are low. That is, the signal goes high for the falling edge of PLL4x before the falling edge of PLL4x when all the clock signals have their rising edges aligned.

The signal from gate network 70 is communicated to cycle-down circuitry which includes a 2:1 multiplexer 72 and a register defined by back-to-back latches 73 and 74. Multiplexer 72 receives the CycleDown signal at its first (A) input terminal and the output of the register at its second (B) input terminal. The A input is selected when all the counter output signals are low, and the state of CycleDown is passed to the output of latch 73 on the next rising edge of PLL4x and to the output of latch 74 on the next falling edge of PLL4x. Thus, a change in the CycleDown signal appears at the output of latch 74 only on the falling edge of PLL4x that occurs when all the clock signals have their rising edges aligned. This preserves the state of the machine since there is a smooth transition between normal mode and cycle-down mode.

The output from latch 74 is applied to the select inputs of a set of multiplexers 75. Signals corresponding to 1x, 2x, $V_{ss}$ and $V_{cc}$ are communicated to respective first (A) input terminals of multiplexers 75, while the output signals from multiplexers 65 are communicated to respective second (B) input terminals of multiplexers 75. A latch 77 is interposed in one of the paths, in order to provide an effective 90° delay for a ÷2 cycle-down.

The signals from multiplexers 75 as well as a signal at 1x are communicated to respective first (A) input terminals of a set of multiplexers 80. The output terminals of multiplexers 80 provide signals designated PLL1x, 4x, 4x+90°, 2x, and 1x. The output terminals of multiplexers 80 are coupled to those multiplexers' respective second (B) input terminals. The PLL4x signal is communicated to the multiplexers' select input terminals, and (with the exception of the 4x+90° multiplexer) selects the A input when the 4x signal is high. When the PLL4x signal goes low, the B input is selected, but this merely holds the value. When the PLL4x signal again goes high, the A input is selected, and the multiplexer output changes if the input signal value has changed. Thus, the output signal is a version of the input signal with transitions synchronized to the rising edge of the PLL4x signal.

The above-mentioned exception is that the multiplexer 80 in the path that includes flip-flop 77 responds to PLL4x to select the B input when PLL4x goes high. Thus, the output signal (4x+90°) has all transitions synchronized to the falling edge of PLL4x.

The Sync4x signal is provided by the output of a multiplexer 82 having its A and B input terminals held at $V_{cc}$ and $V_{ss}$. The PLL4x signal is communicated to the select input and selects the A input (at $V_{cc}$) when the 4x signal is high and selects the B input (at $V_{ss}$) when the 4x signal is low.

Figure 4:
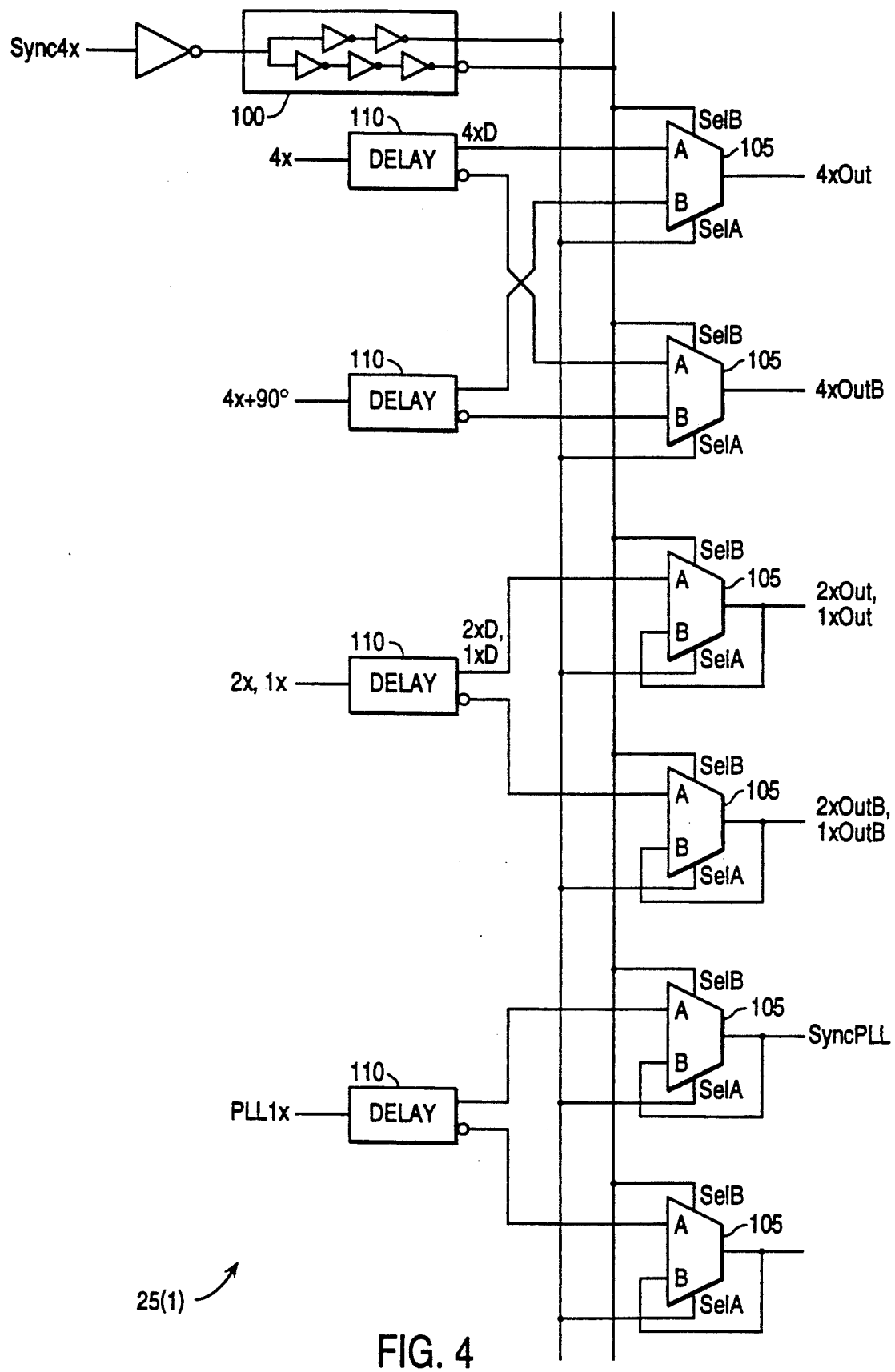
FIG. 4 is a logic schematic of the remote clock synchronization circuit for one remote location.

FIG. 4 is a logic schematic of one of the remote clock synchronization circuits, say RCS circuit 25(1). As will be described below, the signals provided by clock generator 12 and distributed to the remote locations on the clock distribution lines are received at the remote locations and are synchronized to the falling edge of Sync4x to provide output signals 4xOut, 2xOut, and 1xOut. The circuit also generates complementary output signals, designated with the suffix "B".

Specifically, the Sync4x signal is inverted and converted to a complementary pair at a splitter 100, the operation of which is as follows. The input signal is divided and directed along two paths, one of which passes through two inverters and the other of which passes through three inverters. The sizes of the devices are chosen so that the propagation time along both paths is the same, notwithstanding that there are more stages in the inverting path. (This dual-clock arrangement is also used in the circuitry shown in simplified form in FIG. 3).

The complementary Sync4x signals are distributed to the select input terminals of a set of 2:1 multiplexers 105. When Sync4x is high, the second (B) input is selected; when Sync4x is low, the first (A) input is selected. The 4x, 4x+90°, 2x, and 1x signals are communicated through respective delay lines 110 to provide delayed complementary pair versions of the incoming signals. The delay lines are configured in the manner of splitter 100 except that there are six and seven gates in the two paths, to provide a delay on the order of 1.5-2 ns (less than a half cycle of Sync4x).

As mentioned above, the 4xOut signal in normal mode is synthesized from the 4x and 4x+90° signals which are communicated as fixed voltage levels ($V_{cc}$ and $V_{ss}$). At the same time, in cycle-down mode, the signals on 4x and 4x+90° lines are divided down square waves. The multiplexer for 4xOut receives the delayed 4x signal (4xD) at its first (A) input terminal and the delayed 4x+90° signal at its second (B) input terminal. When Sync4x is high, the B input (at $V_{ss}$) is selected, and 4xOut is low. When Sync4x goes low, the A input (at $V_{cc}$) is selected and 4xOut goes high. Thus, 4xOut is a signal at the same frequency as Sync4x, but with its rising edge synchronized to the falling edge of Sync4x. In cycle-down mode, the delayed 4x signal leads the delayed 4x+90° signal by half a Sync4x cycle, and the result is an output signal that changes state as often as the input signal, but has its rising edge synchronized to the falling edge of Sync4x.

The mechanism for generating the 2xOut (or 1xOut) signal from the 2x (or 1x) signal is somewhat different in that the delayed version of the signal (2xD or 1xD) is communicated to the multiplexer's A input terminal and the multiplexer's output terminal is connected to the multiplexer's B input terminal. Accordingly, when Sync4x is high, the B input is selected, which corresponds to the output, and therefore, the signal output from the multiplexer is maintained, even if the input signal at the first input terminal changes. However, when Sync4x goes low, the A input is selected, and the actual signal level at the input terminal is selected. At the next rising edge of Sync4x, the output of the multiplexer is maintained, so the output can only change at the falling edge of Sync4x. The SyncPLL signal is generated from the PLL1x signal in the same way that the 2xOut and 1xOut signals are generated from the 2x and 1x signals.

Figure 5A:
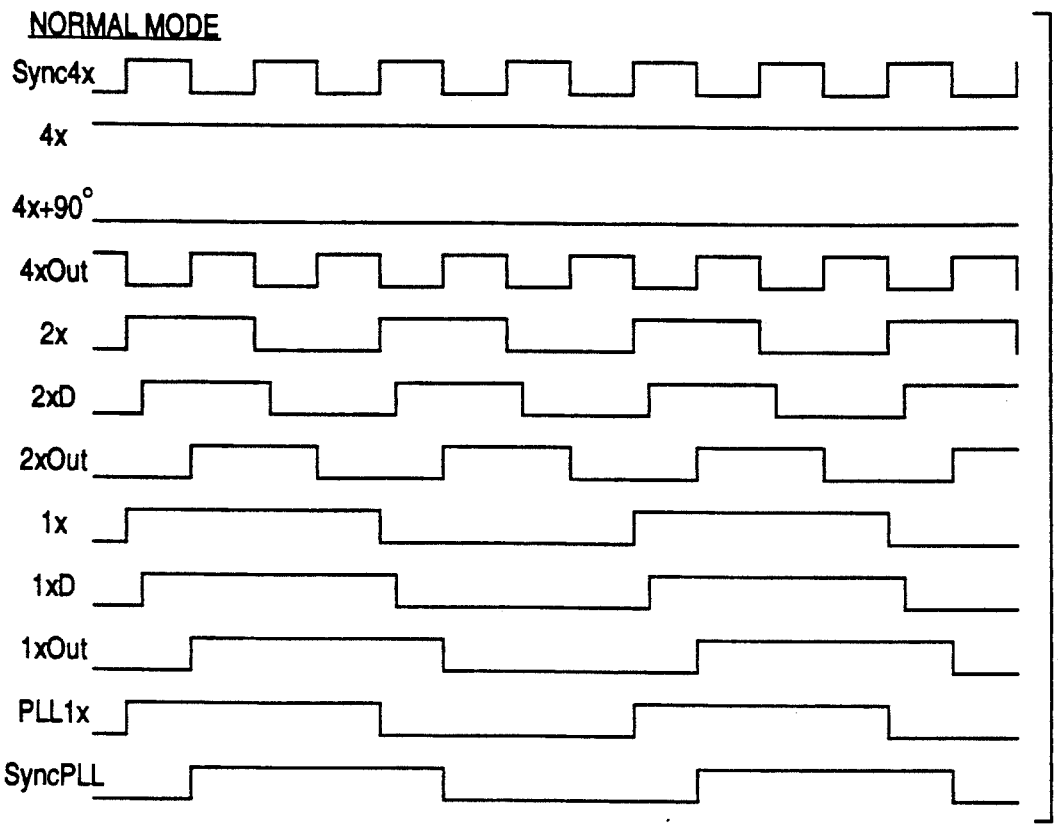
FIGS. 5A and 5B are timing diagrams of the clock signals at the remote location in normal mode and cycle-down mode, respectively.

FIG. 5A is a timing diagram showing the signals incoming to the RCS circuit and the output clock signals generated thereby for the normal mode. The complementary output clock signals are not shown since they are merely the inverses of the signals that are shown. As can be seen, the delayed versions of the incoming clock signals are delayed by an amount that is less than half a cycle of Sync4x.

Figure 5B:
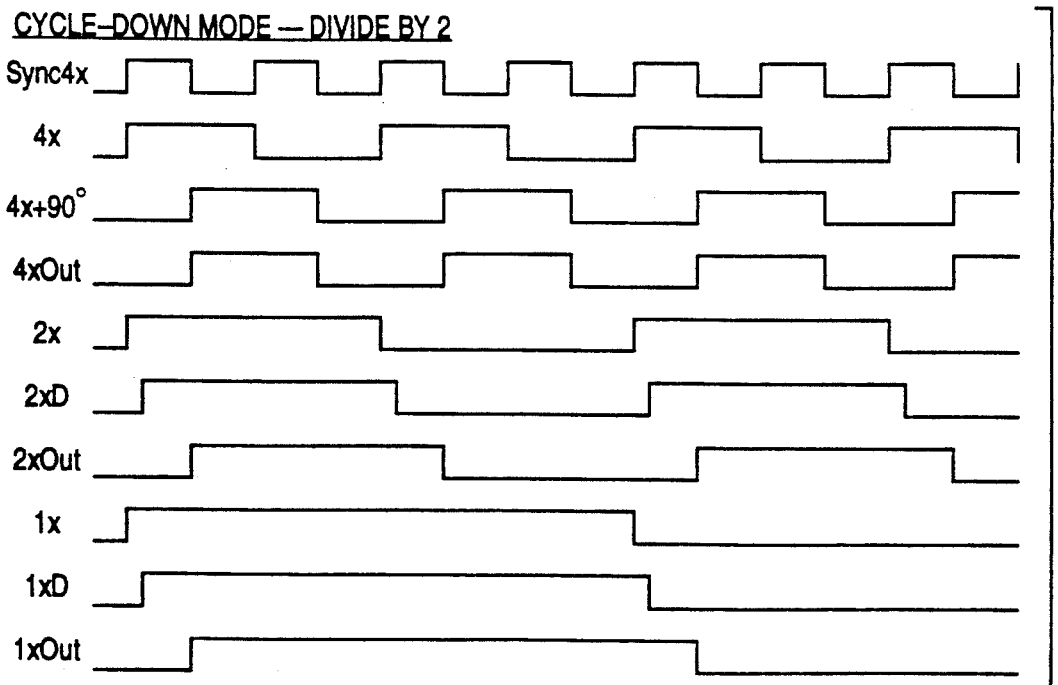

FIG. 5B shows the corresponding signals in the cycle-down mode. The particular example shows a divisor of 2. It should be understood that the phase difference between the 4x and the 4x+90° signals remains half a Sync4x cycle, even for other divisors. The PLL1x and SyncPLL signals are not shown since they are the same as in FIG. 5A.

Figure 6A:
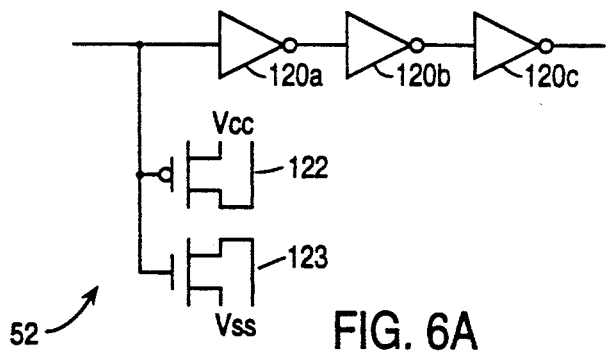
FIGS. 6A and 6B are circuit schematics of the clock drivers at the remote clock synchronization circuit.

FIG. 6A is a circuit schematic of one of drivers 52 at one of RCS circuits 25. There are actually six such circuits, corresponding to the three complementary pairs shown as outputs in FIG. 4. Driver 52 is configured to present a constant load (mainly capacitive) at its input, regardless of fanout (i.e., no matter how many of final drivers 55 it drives).

Each driver 52 comprises three cascaded inverters 120a-c with a pair of transistors 122 and 123 connected as capacitors (drain and source of p-channel device tied to $V_{cc}$; drain and source of n-channel device tied to $V_{ss}$). Transistors 122 and 123 have their gates connected to the input of the first inverter. The inverters (each of which includes an n-channel driver and p-channel driver), are sized according to the required fanout, while transistors 122 and 123 are sized so that all of drivers 52 present the same load at their respective inputs.

Figure 6B:
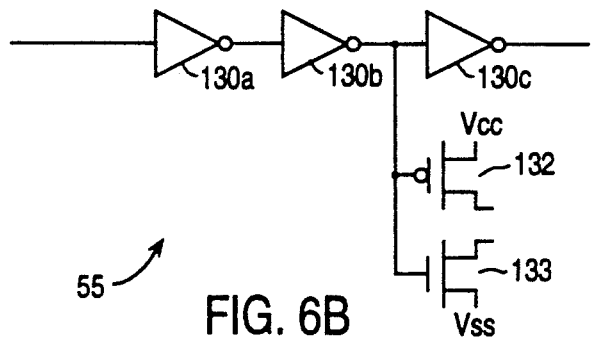

FIG. 6B is a circuit schematic of one of the final clock drivers 55. Each driver 55 comprises three cascaded inverters 130a–c with a pair of transistors 132 and 133 having their gates connected to the input of the last inverter. The first two inverters are of a constant size from driver to driver while the last is sized according to the load (the number of clock inputs) it must drive. Transistors 132 and 133 are connected to function as capacitors, but with the drains floating to reduce the number of interconnects. These transistors are sized to present a constant capacitive load to inverter 130b, compensating for differences due to the variable size of inverter 130c.

In conclusion, it can be seen that the present invention provides effective and efficient techniques for generating, distributing, and synchronizing clock signals on a chip. While the above is a complete description of the preferred embodiments of the present invention, various modifications, alternative constructions, and equivalents can be used. Therefore, the above description and illustration should not be taken as limiting the scope of the invention which is defined by the claims.

TABLE 1

| Clock Distribution Remote Regions | |
|---|---|
| Location | Circuitry |
| 1 | Floating Point Unit |
| 2 | Floating Point Unit |
| 3 | Memory Management Unit |
| 4 | Data Cache |
| 5 | Chip Transceivers |
| 6 | Chip Transceivers |
| 7 | Instruction Cache |
| 8 | Chip Transceivers |
| 9 | Integer Unit |
| 10 | Integer Unit |
| 11 | Integer Unit |
| 12 | System Interface |
|  | Integer Unit |
|  | Clock Generator PLL |

What is claimed is:

1. A clock signal distribution system for a chip comprising:
means for generating a synchronization signal and a plurality of clock signals having respective frequencies that are in an integral fraction relationship to one another and are synchronized at a location, designated the initial location, on the chip;
first distributing means for distributing at least one of said plurality of clock signals to each of a plurality of M locations, designated remote locations, on the chip with delay times among said remote locations being approximately equal to one another to a first level of precision;
second distributing means for distributing said synchronization signal to each of said remote locations with delay times being approximately equal to one another to a second level of precision greater than said first level of precision; and
a plurality of M synchronization means, each located at a respective remote location and responsive to said at least one of said plurality of clock signals at the respective remote location and to said synchronization signal at the respective remote location, for synchronizing said at least one of said plurality of clock signals at the respective remote location;
whereby said pluralities of clock signals at said remote locations are characterized by delay times that are approximately equal to each other to said second level of precision notwithstanding the fact that said distributing first means distributes said plurality of clock signals to said remote locations with said first level of precision.

2. A clock signal distribution system for a chip comprising:
means for generating an initial plurality of clock signals having respective frequencies that are in an integral fraction relationship to one another;
first synchronization means, responsive to said initial plurality of clock signals, for generating a synchronization signal and for synchronizing said initial plurality of clock signals at a location, designated the initial location, on the chip;
first distributing means for distributing at least one of said initial plurality of clock signals to each of a plurality of M locations, designated remote locations, on the chip with delay times among said remote locations being approximately equal to one another to a first level of precision;
second distributing means for distributing said synchronization signal to each of said remote locations with delay times being approximately equal to one another to a second level of precision greater than said first level of precision; and
a plurality of M second synchronization means, each located at a respective remote location and responsive to said at least one of said initial plurality of clock signals at the respective remote location and to the synchronization signal at the respective remote location, for resynchronizing said at least one of said initial plurality of clock signals at the respective remote location, to form pluralities of resynchronized clock signals;
whereby said pluralities of resynchronized clock signals at said remote locations are characterized by delay times that are approximately equal to each other to said second level of precision notwithstanding the fact that said first distributing means distributes said plurality of clock signals to said remote locations with said first level of precision.

3. A clock signal distribution system for a chip comprising:
means for generating an initial plurality of clock signals having respective frequencies that are in an integral fraction relationship to one another, each of said initial plurality of clock signals having at least one timing mark during each cycle;
first synchronization means, responsive to said initial plurality of clock signals, for generating a synchronization signal and a first plurality of derived clock signals at a location, designated the initial location, on the chip;
said first plurality of derived clock signals having the same frequencies and timing marks as said initial plurality of clock signals and further being characterized in that said first plurality of derived clock signals have respective timing marks that occur at substantially the same time at repeating intervals defined by said integral fraction relationship;
first distributing means for distributing at least one of said first plurality of derived clock signals to each of a plurality of M locations, designated remote locations, on the chip;

said first distributing means being characterized by delay times for said at least one of said first plurality of derived clock signals at each of said remote locations, said delay times being approximately equal to one another to a first level of precision;

second distributing means for distributing said synchronization signal to each of said remote locations;

said second distributing means being characterized by delay times for said synchronization signal at each of said remote locations, said delay times being approximately equal to one another to a second level of precision greater than said first level of precision;

a plurality of M second synchronization means, each located at a respective remote location and responsive to the first plurality of derived clock signals at the respective remote location and to the synchronization signal at the respective remote location, for generating a second plurality of derived clock signals at the respective remote location;

for each given remote location, the second plurality of derived clock signals at the given remote location having the same frequencies and timing marks as said initial plurality of clock signals and further being characterized in that the second plurality of derived clock signals at the given remote location have respective timing marks that occur periodically with a period defined by said integral fraction relationship;

whereby the second plurality of derived clock signals at said remote locations are characterized by delay times that are approximately equal to each other to said second level of precision notwithstanding the fact that said first distributing means distributes said first plurality of derived clock signals at said remote locations with said first level of precision.

4. The clock signal distribution system for a chip of claim 3, wherein said timing mark of a clock signal is one of a rising edge or a falling edge.

5. A clock generator comprising:
means for generating a plurality of clock signals having respective frequencies that are in an integral fraction relationship to one another;
each given clock signal of said plurality of clock signals having at least one timing mark during each cycle of said given clock signal;
said plurality of clock signals having respective timing marks that occur periodically with a period defined by said integral fraction relationship;
said plurality of clock signals having first and second subsets of clock signals characterized by first and second subsets of frequencies wherein each frequency in said first subset is a particular integer multiple of one frequency in said second subset, said particular integer being designated the cycle-down divisor;
means, responsive to said first and second subsets of clock signals and to an input signal specifying which of said first and second subsets of clock signals is to be selected, for generating a select signal, including means for preventing said select signal from changing state except during an interval when the clock signals in said first and second subsets have relative phases equal to a predefined phase relationship; and means, responsive to said select signal, for selecting one or the other of said first and second subsets of clock signals for output.

6. The clock generator of claim 5 wherein said first and second subsets of frequencies include at least one frequency in common.

7. The clock generator of claim 5 wherein said predefined phase relationship is that all the clock signals in said first and second subsets have their respective leading edges aligned.

8. The clock generator of claim 5, wherein said timing mark is one of a rising edge or a falling edge.

9. A clock signal distribution system for a chip comprising:
a synchronization circuit which outputs a synchronization signal and a plurality of clock signals having respective frequencies that are in an integral fraction relationship to one another and are synchronized at a location, designated the initial location, on the chip;
a set of clock distribution lines which distribute at least one of said plurality of clock signals to each of a plurality of M locations on the chip, designated remote locations, with delay times among said remote locations being approximately equal to one another to a first level of precision;
a set of synchronization distribution lines which distribute said synchronization signal to each of said remote locations with delay times being approximately equal to one another to a second level of precision greater than said first level of precision; and
a plurality of M remote clock synchronization circuits, each located at a respective remote location and responsive to said at least one of said plurality of clock signals at the respective remote location and to said synchronization signal at the respective remote location, wherein a remote clock synchronization circuit synchronizes said at least one of said plurality of clock signals at said respective remote location;
whereby said pluralities of clock signals at said remote locations are characterized by delay times that are approximately equal to each other to said second level of precision notwithstanding the fact that said set of clock distribution lines distribute said plurality of clock signals to said remote locations with said first level of precision.

10. A clock generator comprising:
a clock generator circuit which outputs a plurality of clock signals having respective frequencies that are in an integral fraction relationship to one another;
each given clock signal of said plurality of clock signals having at least one timing mark during each cycle of said given clock signal;
said plurality of clock signals having respective timing marks that occur periodically with a period defined by said integral fraction relationship;
said plurality of clock signals having first and second subsets of clock signals characterized by first and second subsets of frequencies wherein each frequency in said first subset is a particular integer multiple of one frequency in said second subset, said particular integer being designated the cycle-down divisor;
a clock-divider responsive to said first and second subsets of clock signals and to an input signal specifying which of said first and second subsets of clock signals is to be selected, which generates a select signal, wherein said select signal does not change state except during an interval when the clock signals in said first and second subsets have relative phases equal to a predefined phase relationship; and a multiplexer with a select input coupled to receive said select signal and inputs for said first and second subsets of clock signals, and an output which outputs said first subset of clock signals when said select signal is in a first state and said second subset of clock signals when said select signal is in a second state.

* * * * *